(12) United States Patent
Gong

(10) Patent No.: US 8,212,276 B2
(45) Date of Patent: Jul. 3, 2012

(54) ARRANGEMENT OF ELECTRODES FOR LIGHT EMITTING DEVICE

(75) Inventor: Myeong-Kook Gong, Gyeonggi-do (KR)

(73) Assignee: Epiplus Co., Ltd., Pyongtaek (KR)

( * ) Notice: Subject to any disclaimer, the term of this patent is extended or adjusted under 35 U.S.C. 154(b) by 426 days.

(21) Appl. No.: 11/992,058

(22) PCT Filed: Sep. 13, 2006

(86) PCT No.: PCT/KR2006/003631
§ 371 (c)(1),
(2), (4) Date: Jul. 28, 2009

(87) PCT Pub. No.: WO2007/032638
PCT Pub. Date: Mar. 22, 2007

(65) Prior Publication Data
US 2010/0006885 A1    Jan. 14, 2010

(30) Foreign Application Priority Data

Sep. 15, 2005 (KR) .................. 10-2005-0086273
Jan. 20, 2006 (KR) .................. 10-2006-0006484

(51) Int. Cl.
*H01L 33/00* (2010.01)
(52) U.S. Cl. ............... 257/99; 257/79; 257/81; 257/98; 257/103; 257/E33.058; 257/E33.062; 438/22; 438/26
(58) Field of Classification Search ............ 257/13, 257/79–103, E51.018–E51.022, E33.001–E33077, 257/E25.028, E25.032; 438/22–47, 69, 493, 438/503, 507
See application file for complete search history.

(56) References Cited

U.S. PATENT DOCUMENTS

| 6,650,018 B1 | 11/2003 | Zhao et al. | |
|---|---|---|---|
| 2003/0218176 A1* | 11/2003 | Zhao et al. | 257/81 |
| 2006/0192223 A1* | 8/2006 | Lee et al. | 257/99 |
| 2006/0289881 A1* | 12/2006 | Chen et al. | 257/91 |
| 2007/0105261 A1 | 5/2007 | Han et al. | |

FOREIGN PATENT DOCUMENTS

| JP | 2004-228554 | | 8/2004 |
|---|---|---|---|
| JP | 10-0501109 | * | 7/2005 |
| KR | 102002-008471 | | 11/2002 |
| KR | 10-2005-0016522 | * | 2/2005 |
| KR | 10-0501109 | * | 7/2005 |
| KR | 1020050063924 | | 7/2005 |
| TW | 291243 | * | 6/2005 |

OTHER PUBLICATIONS

International Search Report and Written Opinion dated Dec. 16, 2006 for PCT/KR2006/003631 (WO2007/032638).

* cited by examiner

*Primary Examiner* — A. Sefer
*Assistant Examiner* — Farid Khan

(57) ABSTRACT

A light emitting diode includes an n-GaN layer on a substrate, an active layer exposing a part of the n-GaN layer, a p-GaN layer on the active layer, a cathode contacting the exposed n-GaN layer and extending from one side of the active layer toward the other side, and an anode formed on the p-GaN layer and including a plurality of sub-electrodes spaced apart from both sides of the cathode and an edge of the active layer at the same distance.

12 Claims, 4 Drawing Sheets

[Fig. 1]
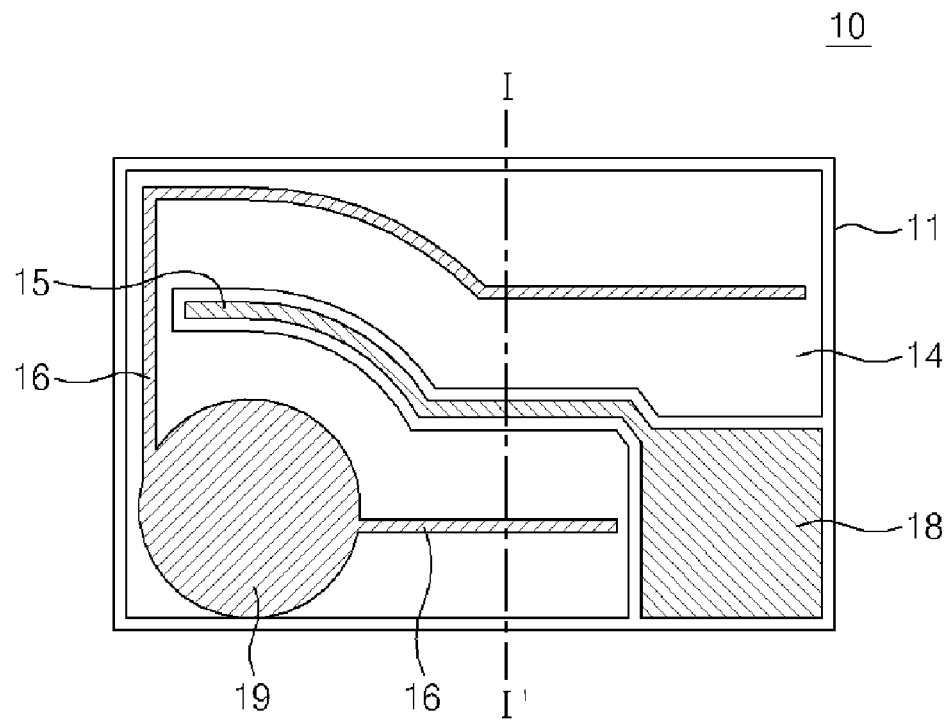
[Fig. 2]
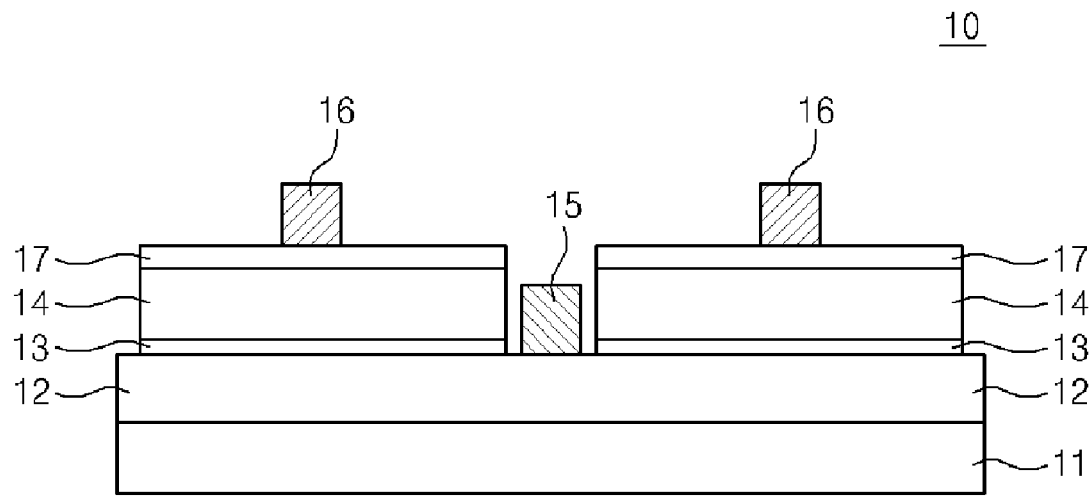

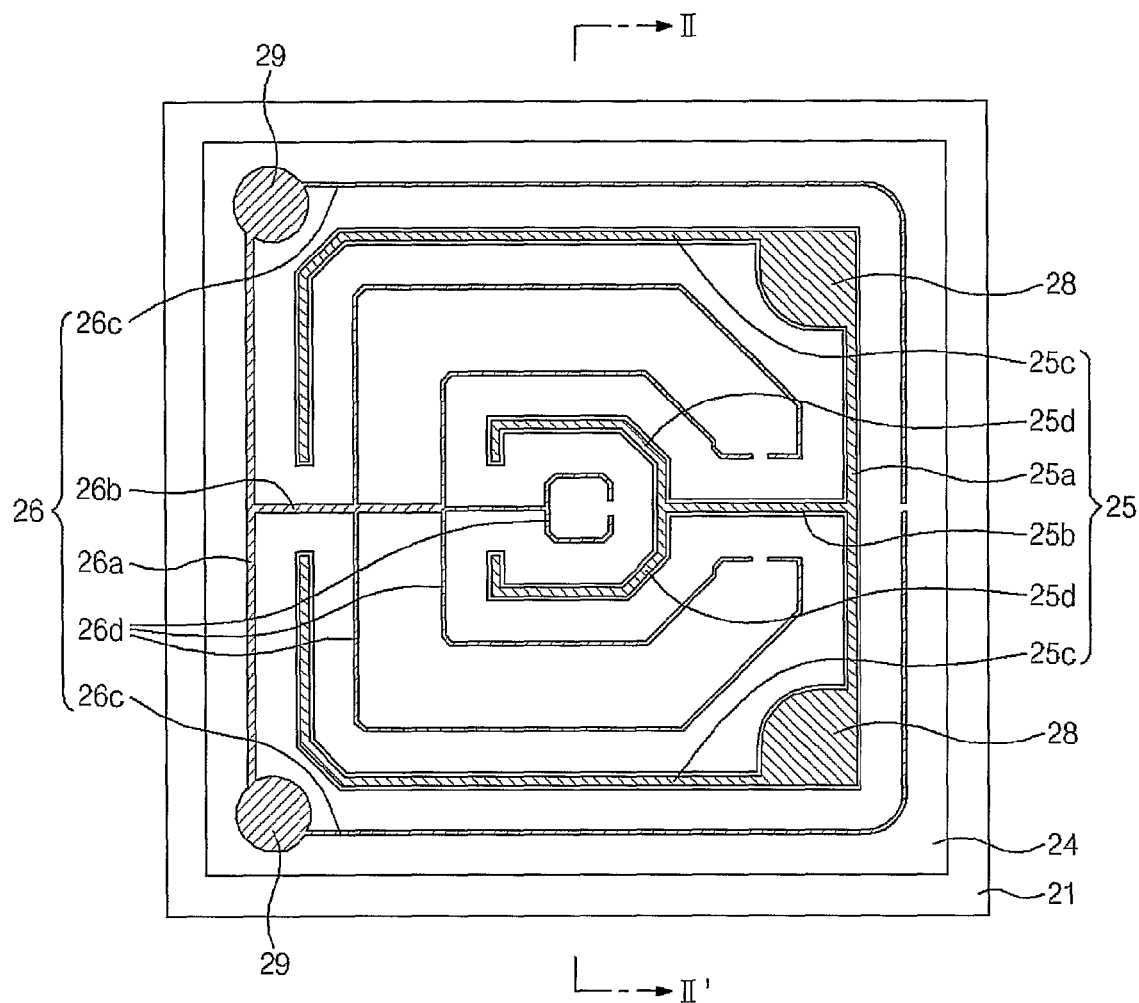
[Fig. 3]

[Fig. 4]
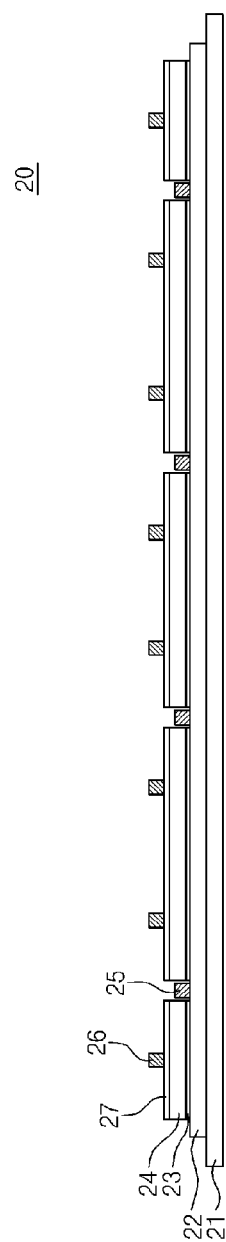
[Fig. 5]
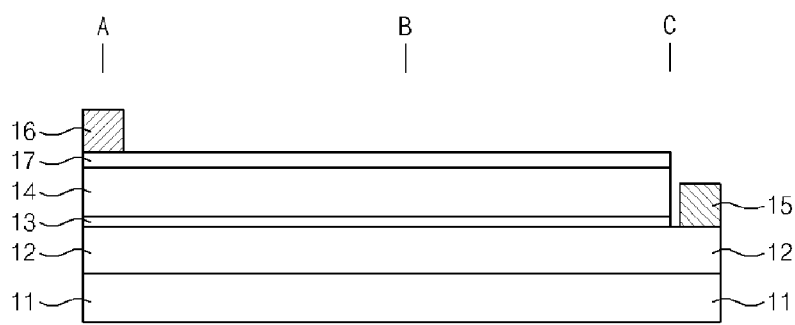

[Fig. 6]
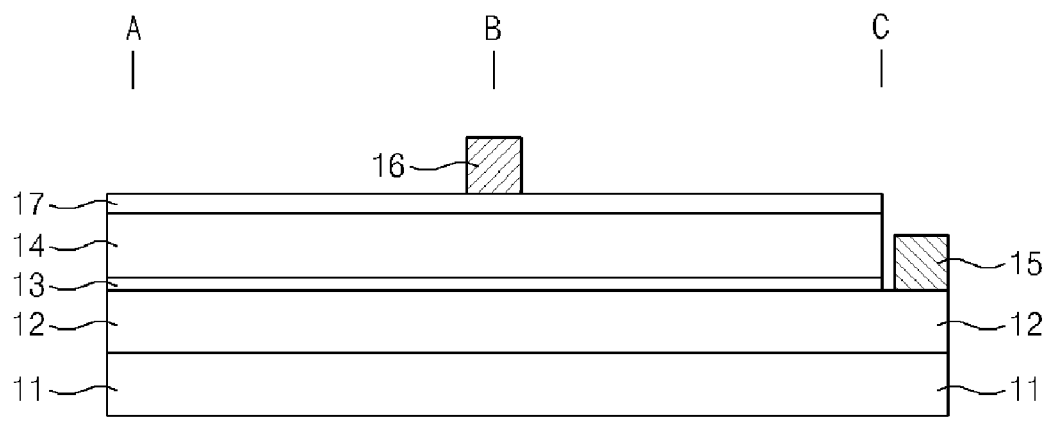
[Fig. 7]
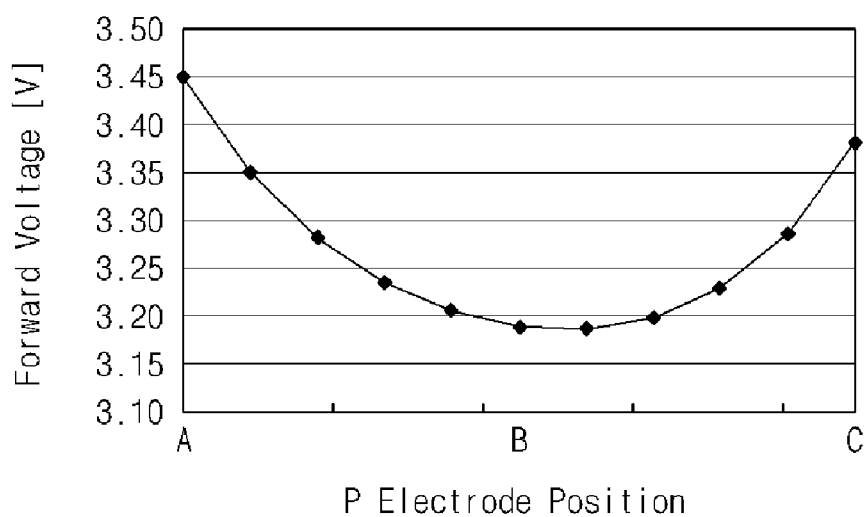
[Fig. 8]
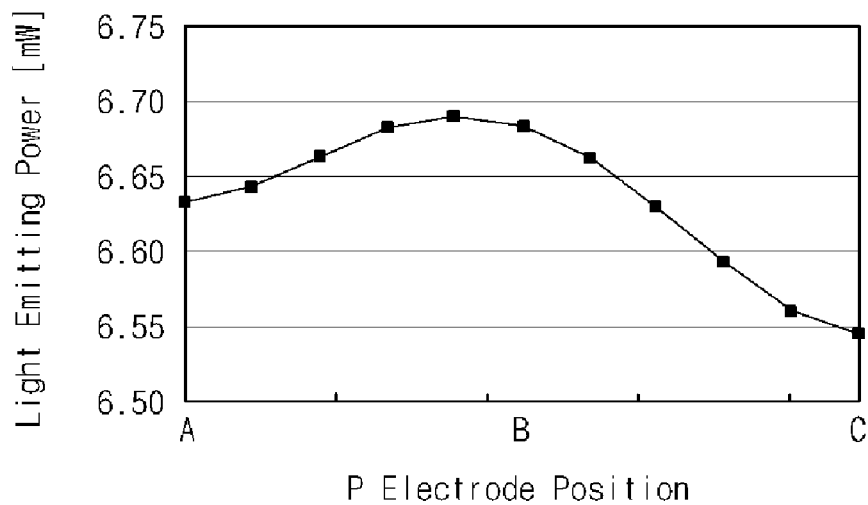

ARRANGEMENT OF ELECTRODES FOR LIGHT EMITTING DEVICE

TECHNICAL FIELD

The present invention relates to a light emitting diode, and more particularly to an arrangement of electrodes for a light emitting diode.

BACKGROUND ART

In general, a light emitting diode (LED) is being widely used as a light source for a display device because of its small size, low power consumption and high reliability. The light emitting diode uses a compound semiconductor such as aluminum gallium arsenide (AlGaAs), gallium aluminum phosphide (GaAlP), gallium phosphide (GaP), indium gallium aluminum phosphide (InGaAlP), gallium nitride (GaN), and the like. The light emitting diode includes an n-type semiconductor layer formed of the compound semiconductor, an active layer on the n-type semiconductor layer, and a p-type semiconductor layer on the active layer. An n-electrode and a p-electrode are electrically connected to the n-type semiconductor layer and the p-type semiconductor layer, respectively. When an electric current is applied to the n-electrode and the p-electrode from the outside, current is injected to the active layer, thereby emitting light.

To increase luminous efficiency of the light emitting diode, the current applied to the light emitting diode needs to be spatially diffused for the uniform flow through the entire active layer. The n-type semiconductor layer is formed of a material having a relatively good conductivity, but resistance that blocks diffusion of the current still exists. For the uniform diffusion of the current, various arrangements of the electrodes have been made. The electrode arrangements according to the conventional art are disclosed in U.S. Pat. No. 5,652,432, No. 6,307,218, and No. 6,344,665, and U.S. Patent Laid-open publication No. 2004/0140473.

According to the conventional art, an n- or p-electrode is disposed at an edge of an emission surface of the LED. Such an electrode arrangement causes the distance between the electrodes to increase, and thus the resistance is increased to thus limit driving at a low voltage. Alternatively, the n-electrode and the p-electrode are connected to respective bonding pads in the form of a plurality of fingers or branches, and the fingers or branches of the n- and p-electrodes alternate each other. However, this alternating arrangement of the electrodes are problematic in that it covers a large area of the active layer, lowering the luminous efficiency.

DISCLOSURE OF INVENTION

Technical Problem

The present invention provides a light emitting diode having an electrode arrangement structure capable of achieving high optical output efficiency and improving forward voltage characteristic.

Technical Solution

Embodiments of the present invention provide light emitting diodes including: a substrate; a first conductivity type first semiconductor layer formed on the substrate; an active pattern formed on the first semiconductor layer to expose a part of the first semiconductor layer; a second conductivity type second semiconductor layer formed on the active pattern; a first electrode contacting the exposed first semiconductor layer and extending from one side of the active pattern to the other side; and a second electrode formed on the second semiconductor layer and including a plurality of second sub-electrodes spaced apart from both sides of the first electrode at a predetermined distance. Of the second sub-electrodes, the outermost second sub-electrode adjacent to an edge of the active pattern is substantially spaced apart from the edge of the active pattern at the predetermined distance.

In some embodiments, the first electrode may include a plurality of first sub-electrodes. A pair of second sub-electrodes of the plurality of second sub-electrodes may be provided between the first sub-electrodes lying adjacent to each other in a mutually opposing manner, and the adjacent first sub-electrodes may be spaced apart from the pair of second sub-electrodes at the predetermined distance.

In other embodiments, the first sub-electrodes may diverge and extend from a middle portion of one side of the active pattern toward the other side, and the second sub-electrodes may diverge and extend from a middle portion of the other side of the active pattern toward the one side.

In other embodiments of the present invention, light emitting diodes include a substrate; a first conductivity type first semiconductor layer formed on the substrate; an active pattern formed on the first semiconductor layer to expose a part of the first semiconductor layer; a second conductivity type second semiconductor layer formed on the active pattern; a first electrode contacting the exposed first semiconductor layer and including a plurality of first sub-electrodes extending from one side of the active pattern toward the other side; and a second electrode formed on the second semiconductor layer and including a pair of second sub-electrodes provided between the first sub-electrodes lying adjacent to each other in a mutually opposing manner. The adjacent first sub-electrodes are spaced apart from the pair of second sub-electrodes at a distance corresponding to one quarter of a distance between the adjacent first sub-electrodes.

In still other embodiments of the present invention, light emitting diodes include a substrate; a first conductivity type first semiconductor layer formed on the substrate; an active pattern formed on the first semiconductor layer to expose a part of the first semiconductor layer; a second conductivity type second semiconductor layer formed on the active pattern; a first electrode contacting the exposed first semiconductor layer and including a plurality of first sub-electrodes extending from one side of the active pattern toward the other side; and a second electrode formed on the second semiconductor layer and including second sub-electrodes provided between the first sub-electrodes. A distance between the first sub-electrodes lying adjacent to each other in a mutually opposing manner is twice longer than a distance between the outermost first sub-electrode adjacent to an edge of the active pattern and the edge of the active pattern.

Advantageous Effects

A current flowing between an anode and a cathode may be distributed uniformly between an edge portion and a center portion of an active pattern. Accordingly, a forward voltage characteristic of a light emitting diode can be improved, and optical output may be improved in terms of quantum efficiency within the light emitting diode based on the current distribution characteristic.

BRIEF DESCRIPTION OF THE DRAWINGS

FIG. 1 is a plan view for describing a light emitting diode according to one embodiment of the present invention;

FIG. 2 is a cross-sectional view taken along dotted line I-I' of FIG. 1 for describing the light emitting diode according to one embodiment of the present invention;

FIG. 3 is a plan view for describing a light emitting diode according to another embodiment of the present invention;

FIG. 4 is a cross-sectional view taken long dotted line II-II' of FIG. 3 for describing the light emitting diode according to another embodiment of the present invention;

FIGS. 5 and 6 are exemplary views of a p-electrode arrangement for describing optical output and voltage characteristics according to embodiments of the present invention;

FIG. 7 is a graph for describing the voltage characteristic according to embodiments of the present invention; and FIG. 8 is a graph for describing the optical output characteristic according to embodiments of the present invention.

BEST MODE FOR CARRYING OUT THE INVENTION

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. It will also be understood that when a layer (or film) is referred to as being on another layer or substrate, it can be directly on the other layer or substrate, or intervening layers may also be present. Like reference numerals refer to like elements throughout.

It will be understood that although the terms first and second are used herein to describe various regions, materials, these regions and materials should not be limited by these terms. These terms are only used to distinguish one region from another region. Thus, It will be understood that although the terms first and second are used herein to describe various regions, layers and/or sections, these regions, layers and/or sections should not be limited by these terms. These terms are only used to distinguish one region, layer or section from another region, layer or section. Thus, for example, a first element discussed below could be termed a second element, and similarly, a second element may be termed a first element without departing from the teachings of the present invention.

Referring to FIGS. 1 and 2, a light emitting diode will now be described according to one embodiment of the present invention. FIG. 1 is a plan view for describing a light emitting diode (LED) according to one embodiment of the present invention, and FIG. 2 is a cross-sectional view taken along dotted line I-I' of FIG. 1 for describing the LED according to one embodiment of the present invention.

Referring to FIGS. 1 and 2, the LED 10 according to one embodiment of the present invention includes a substrate 11, a first conductivity type first semiconductor layer 12 formed on the substrate 11, an active pattern 13 formed on the first semiconductor layer 12 to expose a portion of the first semiconductor layer 12; a second conductivity type second semiconductor layer 14 formed on the active pattern 13; a first electrode 15 contacting the exposed first semiconductor layer 12; and a second electrode 16 formed on the second semiconductor layer 14.

The substrate 11 may be a sapphire substrate, the first conductivity type may be an n-type, and the second conductivity type may be a p-type. The first semiconductor layer 12 may be an n-GaN layer, and the second semiconductor layer 14 may be a p-GaN layer. A transparent electrode 17 may be further disposed between the second electrode 16 and the second semiconductor layer 14 for the smooth distribution of a current. The transparent electrode 17 may be formed of indium oxide, cadmium oxide, tin oxide, zinc oxide, or the like. The first electrode 15 and the second electrode 16 may be a cathode and an anode, respectively.

Referring to FIG. 1 again, a disposed form of the first electrode 15 on the first semiconductor layer 12 will be now be described. The disposed form of the first electrode corresponds to a portion of the first semiconductor layer 12 exposed by the active pattern 13. The active pattern 13 is made by patterning an active layer formed on the first semiconductor layer 12, and the active layer is patterned, corresponding to the disposed form of the first electrode 15.

The first electrode 15 may extend from one side toward the other side of the active pattern 13. For example, the active pattern may be a quadrangular shape having first, second, third and fourth sides. The first side and the second side, and the third side and the fourth side may face each other, parallel. The first and third sides, and the second and fourth sides are perpendicular to each other. The first electrode 15 may extend from a first bonding pad 18 disposed on the first side toward the second side.

The second electrode 16 may extend from a second bonding pad 19 disposed on the second side toward the first side. The second electrode 16 may be disposed at a first distance from both sides of the first electrode 15. The first bonding pad 18 and the second bonding pad 19 can be understood as parts of the first electrode and the second electrode, respectively. Thus, the first electrode 15 is spaced apart from the second bonding pad 19 at the first distance, and the second electrode 16 is spaced apart from the first bonding pad 18 at the first distance. Preferably, the second electrode 16 is spaced apart from the third side and the fourth side of the active region at the first distance.

Referring to FIGS. 3 and 4, an LED according to another embodiment of the present invention will now be described. FIG. 3 is a plan view for describing a LED according to another embodiment of the present invention, and FIG. 4 is a cross-sectional view taken along dotted line II-II' of FIG. 3 for describing the LED according to another embodiment of the present invention.

Referring to FIGS. 3 and 4, the LED 20 according to another embodiment of the present invention includes a substrate 21, a first conductivity type first semiconductor layer 22 formed on the substrate, an active pattern 23 formed on the first semiconductor layer 22 to expose a part of the first semiconductor layer 22, a second conductivity type second semiconductor layer 24 formed on the active pattern, a first electrode 25 contacting the exposed first semiconductor layer 22, and a second electrode 26 formed on the semiconductor layer 24.

The first substrate 21 may be a sapphire substrate. The first conductivity type may be an n-type, and the second conductivity type may be a p-type. The first semiconductor layer 22 may be formed of an n-GaN, and the second semiconductor layer 24 may be formed of a p-GaN. A transparent electrode 27 may be further disposed between the second electrode 26 and the second semiconductor layer 24 for the smooth distribution of a current. The transparent electrode may be formed of indium oxide, cadmium oxide, tin oxide, zinc oxide, or the like. The first electrode and the second electrode may be a cathode and an anode, respectively.

A disposed form of the first electrode 25 on the first semiconductor layer 22 will now be described. The disposed form of the first electrode 25 corresponds to a portion of the first semiconductor layer 22 exposed by the active pattern 23. The active pattern 23 is made by patterning an active layer formed on the first semiconductor layer 22, and the active layer is patterned corresponding to the disposed form of the first electrode 25. The second semiconductor layer 24 on the active pattern 23 may be patterned as the same shape as that of the active pattern 23.

The first electrode 25 may extend from one side of the active pattern 23 toward the other side. For example, the active pattern 23 may be a quadrangular shape having first, second, third and fourth sides. The first and second sides, and the third and fourth sides may face each other, parallel. The first and third sides are perpendicular to each other, and the second and fourth sides are also perpendicular to each other. The first electrode 25 may include a first main-electrode 25a spaced apart from the first side of the active pattern 23 at a first distance, and first sub-electrodes 25b, 25c and 25d extending toward the opposing side to the first side, that is, the second side.

The first sub-electrodes may include a first center electrode 25b diverging from a middle portion of the first main electrode 25a and extending toward the center of the active pattern 23, and first side electrodes 25c connected to both ends of the first main electrode 25a and extending toward the second side along the third side and the fourth side. The first side electrodes 25c may have portions parallel to the second side. It can be seen that the first main electrode 25a and the first side electrodes 25c have a quadrangular shape spaced apart from a side of the active pattern 23 at the first distance and opened toward the second side. The first center electrode 25b may include first subsidiary electrodes 25d diverging from an end of the first center electrode 25b and disposed at a predetermined interval from the first side electrodes 25c. It can be seen that the first subsidiary electrodes 25d has a quadrangular shape opened toward the second side. It can be seen that the first main electrode 25a and the firs subsidiary electrodes 25b and 25c extend from a middle portion of one side (e.g., the first side) of the active pattern 23 toward the other side (e.g., the second side). Here, the first main electrode 25a can be understood as a part of the first subsidiary electrodes.

A disposed form of the second electrode 26 on the semiconductor layer 24 will now be described. The first second electrode 26 is disposed at the same distance from both sides of the first electrode 25. The same distance may be defined as a second distance. The second electrode 26 may include a second main electrode 26a spaced apart parallel from the second side at the second distance, and second sub-electrodes 26b, 26c and 26c extending toward the opposite side to the second side, that is, the first side.

The second sub-electrodes may include a second center electrode 26b diverging from a middle portion of the second main electrode 26a and extending toward the center of the active pattern 23, and second side electrodes 26c connected to both ends of the second main electrode 26a and extending toward the first side along the third side and the fourth side. The second side electrodes 26c may have portions parallel to the first side. The second center electrode 26b may pass through the opened sides of the first side electrodes 25c and the first subsidiary electrodes 25d. The second main electrode 26a and the second side electrodes 26c can be understood as a quadrangular shape spaced apart from the edge of the active pattern 23 at the second distance, and opened toward the first side. The second main electrode 26a can be understood as a part of the second sub-electrodes. The second main electrode 26a and the outermost second sub-electrodes including the second side electrodes 26c may have a shape substantially encompassing the first electrode at the edge of the active pattern. The second center electrode 26b may include second subsidiary electrodes 26d diverging from the second center electrode 26b and spaced apart from the first electrode 25 at the second distance.

Preferably, the second distance corresponds to the half of the first distance. It can be seen that of the second sub-electrodes, the outermost second sub-electrode adjacent to the edge of the active pattern is spaced apart from the edge of the active pattern at the second distance. Also, it can be seen that a pair of second subsidiary electrodes 26d are provided between the first sub-electrodes lying adjacent to each other in a mutually opposing manner. Preferably, the adjacent first sub-electrodes are spaced apart from the pair of second subsidiary electrodes 26d at the second distance. The second distance may correspond to one quarter of the distance between the adjacent first sub-electrodes.

A bonding pad 28 and a second bonding pad 29 may be disposed at one side of the first main electrode 25a, and one side of the second main electrode 26a, respectively.

In the embodiment of the present invention, the distance between the first sub-electrode lying adjacent to each other in a mutually opposing manner is preferably twice than the distance at which the outermost first sub-electrode (e.g., the side electrodes) and the first main electrode adjacent to the edge of the active pattern are distanced from the edge of the active pattern. By the spatial disposition of the first electrode 25 and the second electrode 26, the distribution characteristic of the current flowing through the first electrode 25 and the second electrode 26 may be uniform between the edge and the center portions of the active pattern.

Referring to FIGS. 5 through 8, the voltage and optical output characteristic of the embodiments of the present invention will now be described. FIGS. 5 and 6 are views showing a section of a left edge of FIG. 2 or 4. For the convenience in description, the reference numerals of FIG. 2 are used. In FIGS. 7 and 8, the position of the p-electrode 16 of FIGS. 5 and 6 is changed from the left edge (point A) to the right edge (point C).

FIG. 7 shows a simulation result of a forward voltage of a PN diode constituting the LED when the drive current is 20 mA. The forward voltage characteristic is improved when the p-electrode is placed at the center as compared to the case where it is placed at the edge. This is because the distribution characteristic of the current flowing between the p-electrode 16 and the n-electrode 15 is improved. FIG. 8 shows an optical output characteristic in consideration of the internal quantum efficiency of the LED based on the current distribution characteristic of FIG. 7. The optical output characteristic is improved when the p-electrode 16 is placed at the center as compared to the case where it is placed at the edge.

Industrial Applicability

The present invention relates to a light emitting diode (LED), and is applicable to the industry using LEDs.

The invention claimed is:

1. A light emitting diode comprising:
a substrate;
a first conductivity type first semiconductor layer on the substrate;
an active pattern on the first semiconductor layer to expose a part of the first semiconductor layer;
a second conductivity type second semiconductor layer on the active pattern;
a first electrode contacting the exposed first semiconductor layer and including a plurality of first sub-electrodes extending from one side of the active pattern toward the other side; and
a second electrode formed on the second semiconductor layer and including a pair of second sub-electrodes provided between the first sub-electrodes lying adjacent to each other in a mutually opposing manner, wherein the adjacent first sub-electrodes are spaced apart from the pair of second sub-electrodes at a distance corresponding to one quarter of a distance between the adjacent first sub-electrodes, respectively.

2. A light emitting diode comprising:

a substrate;

a first conductivity type first semiconductor layer on the substrate;

an active pattern formed on the first semiconductor layer to expose a part of the first semiconductor layer;

a second conductivity type second semiconductor layer on the active pattern;

a first electrode contacting the exposed first semiconductor layer and including a plurality of first sub-electrodes extending from one side of the active pattern toward the other side; and a second electrode on the second semiconductor layer and including second sub-electrodes provided between the first sub-electrodes, wherein a distance between the first sub-electrodes lying adjacent to each other in a mutually opposing manner is twice than a distance between the outermost first sub-electrode adjacent to an edge of the active pattern and the edge of the active pattern.

3. A light emitting diode, comprising:

a substrate;

a first semiconductor layer disposed on the substrate;

an active pattern disposed on the first semiconductor layer, the active pattern having a first edge opposite to a second edge and a third edge opposite to a fourth edge, the first edge arranged between the third and fourth edges;

a second semiconductor layer disposed on the active pattern;

a first electrode contacting the first semiconductor layer; and a second electrode contacting the second semiconductor layer;

wherein the second electrode comprises:

a second outer electrode arranged proximal to the first, second, third and fourth edges of the active pattern;

a second line electrode extending from a portion of the second outer electrode near the first edge toward a center of the active pattern; and a second middle electrode extending perpendicularly from the second line electrode and disposed within the second outer electrode; and wherein the first electrode comprises:

a first outer electrode disposed between the second outer electrode and the second middle electrode, wherein the first outer electrode extends near the first, second, third and fourth edges of the active pattern and has a shape substantially conforming to a shape of the second outer electrode;

a first line electrode extending from a portion of the first outer electrode near the second edge and parallel to the second line electrode; and a first inner electrode extending from the first line electrode and surrounded by the second middle electrode.

4. The light emitting diode of claim 3, wherein the second electrode further comprises a second inner electrode connected to the second line electrode, wherein the second inner electrode is surrounded by the first inner electrode.

5. The light emitting diode of claim 4, wherein the second inner electrode extends along the first inner electrode.

6. The light emitting diode of claim 3, wherein the second outer electrode and the first outer electrode are substantially quadrangled.

7. The light emitting diode of claim 3, further comprising second bonding pads on edges of the second main electrode.

8. The light emitting diode of claim 3, further comprising first bonding pads on edges of the first main electrode.

9. The light emitting diode of claim 3, further comprising first bonding pads and second bonding pads, wherein the first bonding pads are adjacent to a first edge of the light emitting diode;

wherein the second bonding pads are adjacent to a second edge of the light emitting diode;

wherein the first edge and the second edge of the light emitting diode are parallel to each other.

10. The light emitting diode of claim 3, wherein the second electrode is substantially spaced apart from sidewalls of the active pattern.

11. The light emitting diode of claim 3, the first outer electrode further comprising a first opening, wherein the second line electrode extends through the first opening.

12. The light emitting diode of claim 3, the second middle electrode further comprising a second opening, wherein the first line electrode extends through the second opening.

* * * * *